United States Patent [19]

Tai et al.

[11] Patent Number: 5,595,605
[45] Date of Patent: Jan. 21, 1997

[54] APPARATUS FOR PREVENTING THE UNSTABLE GROWTH RATE OF OXIDE CAUSED BY WATER VAPOR REMAINING IN THE INLET PIPES OF A HORIZONTAL DRIVEN FIELD OXIDATION TUBE

[75] Inventors: Wen-Kuang Tai, Kau-Hsiung; Ching-Li Shih, Hsin-Chu, both of Taiwan

[73] Assignee: United Microelectronics Corp., Taipei, Taiwan

[21] Appl. No.: 540,775

[22] Filed: Oct. 11, 1995

[51] Int. Cl.⁶ .................................................. C23C 16/00
[52] U.S. Cl. ............................ 118/715; 118/723 ME; 118/423 MP
[58] Field of Search ............................ 118/715, 719, 118/723 ER, 723 ME, 723 MP, 724

[56] References Cited

U.S. PATENT DOCUMENTS

| | | | |
|---|---|---|---|
| 5,370,736 | 12/1994 | Roy et al. | 118/715 |
| 5,445,676 | 8/1995 | Takagi | 118/725 |
| 5,447,568 | 9/1995 | Hayakawa et al. | 118/715 |
| 5,487,784 | 1/1996 | Ellis, Jr. | 118/719 |

*Primary Examiner*—R. Bruce Breneman
*Assistant Examiner*—Felisa Garrett
*Attorney, Agent, or Firm*—Brumbauch, Graves, Donohue & Raymond

[57] ABSTRACT

The invention disclosed an efficient apparatus for solving the problem of unstable growth rate of oxide occurred when the procedure of wet oxidation is processed first and immediately followed by a procedure of dry oxidation. The invention involves in implementing as many insulating sleeves as required for wrapping around inlet pipes of a horizontal driven field oxidation tube to prevent water vapor from remaining in the inlet pipes so as to stabilize the growth rate of oxide.

12 Claims, 3 Drawing Sheets

APPARATUS FOR PREVENTING THE UNSTABLE GROWTH RATE OF OXIDE CAUSED BY WATER VAPOR REMAINING IN THE INLET PIPES OF A HORIZONTAL DRIVEN FIELD OXIDATION TUBE

BACKGROUND OF THE INVENTION

A. Field of the Invention

The invention relates to a semiconductor processing equipment, and especially to insulating sleeves wrapping around inlet pipes of a horizontal driven field oxidation tube to prevent water vapor from accumulating in the inlet pipes and causing unstable growth rate of oxide in the process of dry oxidation.

B. Description of the Prior Art

A conventional semiconductor processing equipment includes four parts: source cabinet 11, furnace module 12, load station 13, and controller 14, as shown in FIG. 1. Furnace module 12 contains horizontal driven field oxidation tube 101 for processing wafers. The horizontal driven field oxidation tube 101 is surrounded with heating element 102 for heating wafers inside. At the closed end of the horizontal driven field oxidation tube 101, there are several inlet pipes for gas injection and thermocouple insertion. Load station 13 is a wafer transfer system which can load wafers 103 to horizontal driven field oxidation tube 101. Wafers 103 are placed on top of boat 104 to be delivered by paddle 105 into horizontal driven field oxidation tube 101. Source cabinet 11 contains gas piping (not shown in FIG. 1) and a mass flow controller (not shown in FIG. 1). At the closed end of horizontal driven field oxidation tube 101, there is a gas injector 106 which injects high purity gases into quartz tube 101 such as, $O_2$, $H_2O$, HCL, TCa, TDCE, and so on. Controller 14 controls the factors of processing wafers such like, temperature, timing, air, and recipe.

In a horizontal driven field oxidation tube, normally the procedures of dry oxidation and wet oxidation are processed interchangeably. The procedure of dry oxidation injects oxygen to the tube while the procedure of wet oxidation injects oxygen and hydrogen to the tube. The procedure of wet oxidation is applied when thin layers of oxide, such as 700 Angstroms, is desired. In contrast, the procedure of dry oxidation is applied when a thicker layer of oxide is required, such as 5000 Angstroms. For the same gas sources, the former procedure takes about 7 minutes while the latter procedure 2 hours.

As observed, if the two procedures are processed interchangeably, the growth rate of oxide becomes very unstable. For instance, if the procedure of wet oxidation is processed first and immediately followed by another wet oxidation, then the problem is not obvious. The reason is because the error is relatively small comparing to 5000 Angstroms. Nevertheless, if the procedure of wet oxidation is processed first and immediately followed by the procedure of dry oxidation, then the growth rate of oxide becomes very unstable. Suppose the procedure of dry oxidation is expected to form 700 Angstroms oxide in 7 minutes. Now it forms 800 Angstroms oxide.

The phenomenon of the unstable growth rate of oxide has been noticed for a long time. However, there is no solution to this problem because the cause has not been found yet. As the problem occurs, the only solution is trying to produce the desired thickness of oxide by adjusting the duration of gas injection. For instance, if the procedure of dry oxidation is supposed to form 700 Angstroms oxide in 7 minutes but now forms 800 Angstroms oxide instead. To form 700 Angstroms oxide, the duration of gas injection must be adjusted to 6 minutes. However, in next run, 6 minutes of gas injection may not form 700 Angstroms oxide but only 600 Angstrom oxide. Consequently, the duration of gas injection must be adjusted each time using trial and error.

What is puzzling is the cause for the unstable growth rate of oxide. There are several reasons to consider. Is it due to the steam remains in the tube when cleaning or the temperature not optimized yet? The trial and error method as mentioned above is very tedious. The unstable growth rate of oxide causes a great trouble for semiconductor fabrication that demands exact value of thickness of oxide.

SUMMARY OF THE INVENTION

Accordingly, it is an object of the present invention to provide an apparatus for efficiently solving the problem of unstable growth rate of oxide by preventing water vapor from accumulating at the inlet pipes of a horizontal driven field oxidation tube.

It is another object of the present invention to provide multiple insulation sleeves wrapping around inlet pipes of the horizontal driven field oxidation tube to keep the temperature inside above 100° C. so as to prevent the liquescence of water vapor.

These and other objects of the invention, which will become more apparent as the invention is described more fully below, are obtained by providing an improved apparatus that mainly includes a plurality of insulating sleeves for wrapping around inlet pipes of a horizontal driven field oxidation tube to keep the temperature in the inlet pipes above 100° C. and prevent the liquescence of water vapor. Since there is no water vapor remained in the tube to influence the procedure of dry oxidation processed in next run, the growth rate of oxide becomes stable. The shape of the insulating sleeves is flat with closing devices on both sides for easily wrapping around the inlet pipes of the gas injector and the thermocouple sheaths, and also the outside walls of their matching caps. The thickness of the insulating sleeves is approximately ranging from 0.6 cm to 1.2 cm.

BRIEF DESCRIPTION OF THE DRAWINGS

These and other objects and advantages of the present invention will become apparent by reference to the following description and accompanying drawings wherein.

DETAILED DESCRIPTION OF THE PREFERRED EMBODIMENTS

As the invention disclosed, to efficiently solve the problem, the first thing is to find the cause for the unstable growth rate of oxide occurred in well driven and field driven oxidation. The invention observes that the growth rate of well driven oxide and field driven oxide is unstable under the same conditions. The reason is not because the duration of gas injection or the temperature has not been optimized yet, but rather because a certain amount of water vapor from previous procedure of wet oxidation still remains in next run. As a result, the water vapor remained is enough to participate in the gas reaction in the procedure of dry oxidation and cause the thickness of oxide to increase approximately 50 to 200 Angstroms.

When the procedures of wet oxidation and dry oxidation are performed interchangeably, the water vapor left in the previous procedure of wet oxidation will become drops of water and attached to the inner walls of inlet pipes because the temperature there is lower than 100° C. As the procedure of dry oxidation is performed, the temperature increases again and the drops of water becomes steam again and participates in the gas reaction performed inside. Consequently, the thickness of oxide is thicker than expected. After a few runs, when the duration of gas injection is adjusted accordingly, the water vapor inside the tube is gone. Thus, the newly adjusted time for the procedure of dry oxidation becomes too short. That explains why the growth rate of oxide is so unstable every time when the procedure of dry oxidation is performed immediately followed by the procedure of wet oxidation.

Figure 1:
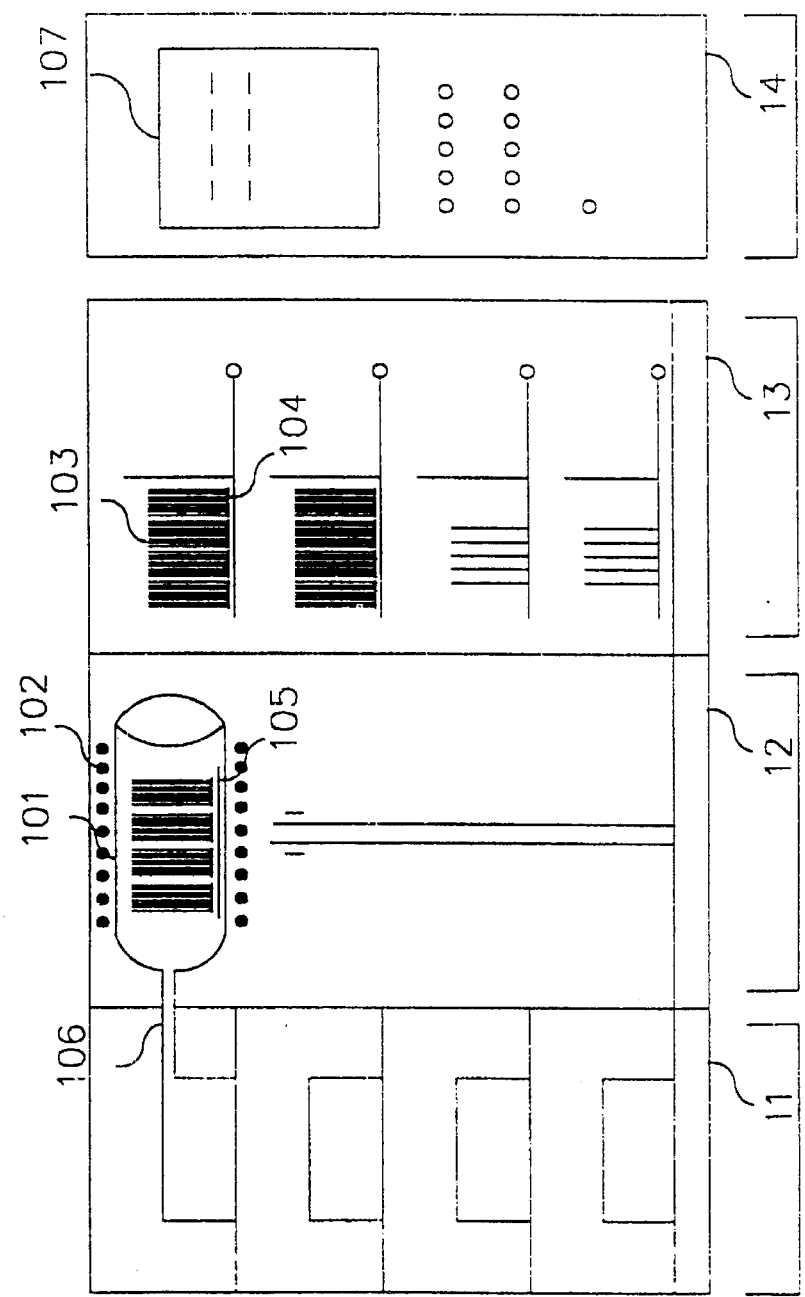
FIG. 1 is a schematic diagram of a semiconductor processing equipment, showing the relative locations of a horizontal driven field oxidation tube.
Figure 2:
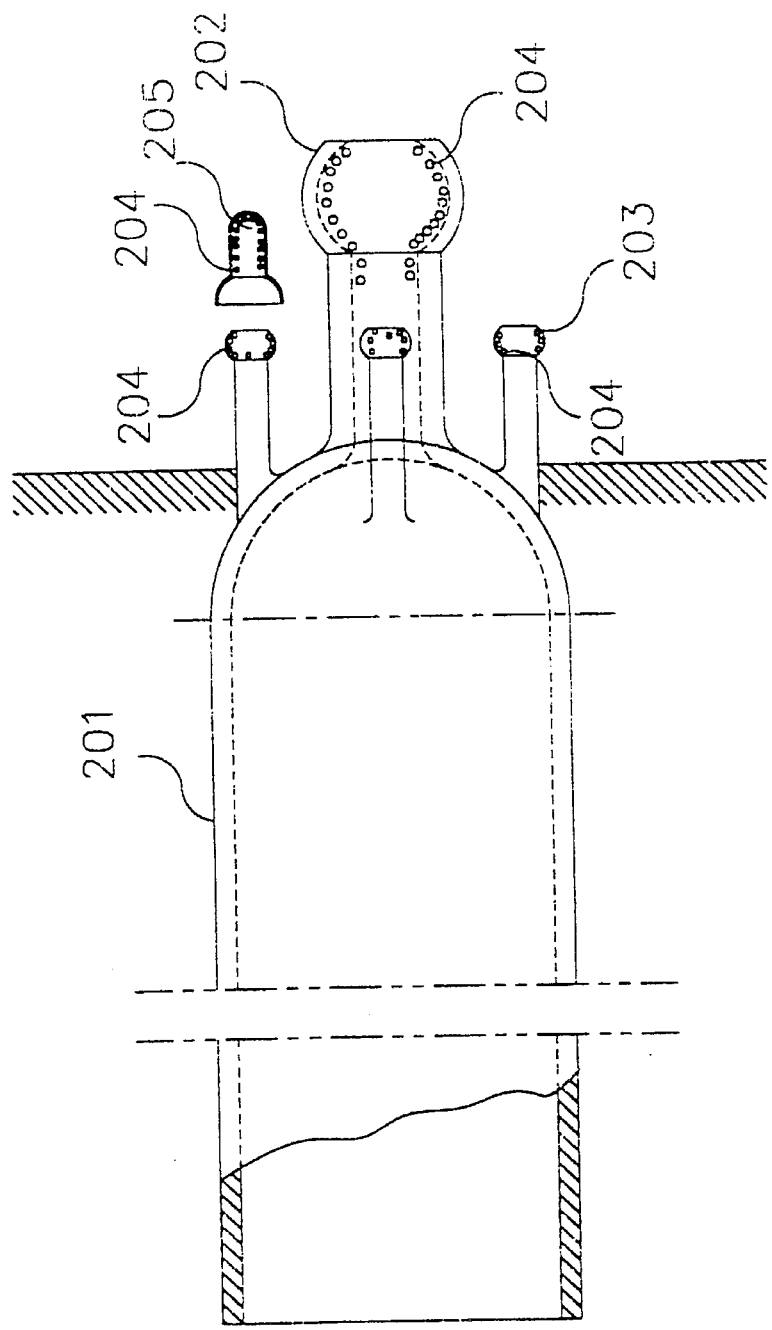
FIG. 2 is a front view, showing multiple inlet pipes mounted at the closed end of a conventional horizontal driven field oxidation tube.

FIG. 2 shows the position where the water vapor left in inlet pipes of a conventional horizontal driven field oxidation tube. A conventional horizontal driven field oxidation tube 201 has a closed end. At the center of the closed end of the tube, there is a gas inlet pipe 202 for injecting high purity gases, such as $O_2$ and $H_2O$. The gas inlet pipe 202 is connected to a ball joint for matching a gas piping. At the edge of the end of the horizontal driven field oxidation tube 201, there are multiple thermocouple sheaths 203 for inserting a thermocouple. The number of thermocouple sheaths is at least one. It depends on the application. The thermocouple sheath is inserted with a thermocouple for temperature measurement. The thermocouple is made of precious metal, such as platinum or nickel. The thermocouple sheath 203 has an opening which can be simply a flat opening or connected to a ball joint. The water vapor remained in the inlet pipe 202 and the thermocouple sheaths 203 will cool down and become drops of water because the temperature in the inlet pipes is lower than 100° C. Referring to FIG. 2, it shows the enlarged drops of water attached to the area 204 where the water vapor is accumulated.

The invention discovers that the accumulation of water vapor is because the temperature in the inlet pipes is lower than 100° C. When processing field oxidation, the temperature for performing the procedure of wet oxidation reaches above 950° C. while the temperature in the inlet pipes is lower than 100° C. Consequently, as the process is finished, the water vapor becomes drops of water and is attached to the inner walls of the inlet pipes. At the next run when dry oxidation is processed, the drops of water will be vaporized and participate in the gas reaction in the procedure of dry oxidation. This causes the thickness of the oxide to increase. This assumption can be proved from the fact that when the process of wet oxidation is performed at 1050° C. there is no water vapor left in the inlet pipes because the temperature in the inlet pipes is above 100° C. As a result, the growth rate of the procedure of dry oxidation stays normal.

For efficiently solving the unstable growth rate of oxide, the invention implements multiple insulating sleeves wrapping around the inlet pipes of the tube to prevent the temperature inside from cooling down. Since the temperature inside the inlet pipes is kept above 100° C., the water vapor will not be liquefied.

Figure 3:
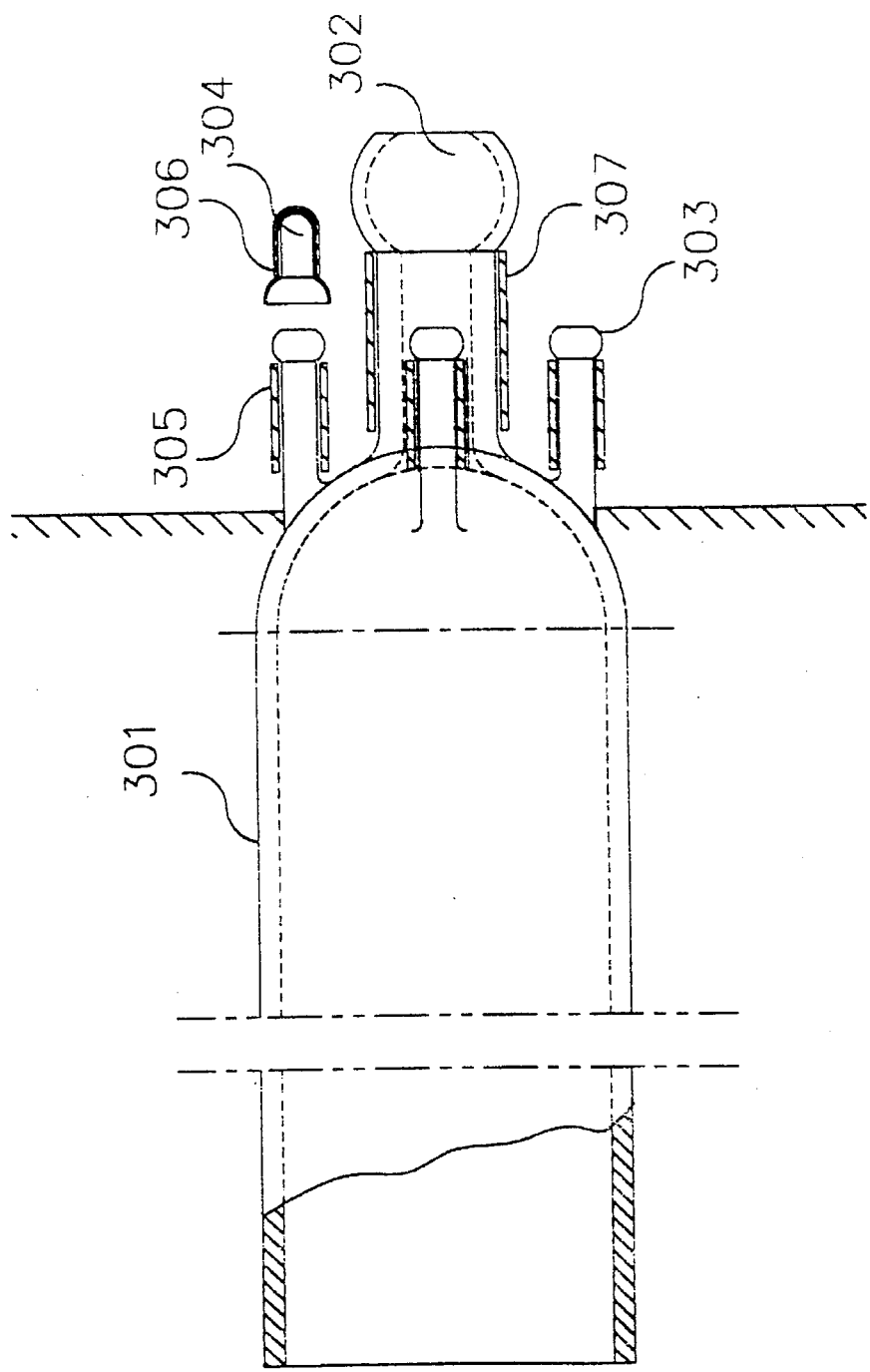
FIG. 3 is a front view, showing multiple insulating sleeves wrapping around the inlet pipes of a conventional horizontal driven field oxidation tube.

The preferred embodiment of the present invention can be illustrated more clearly in FIG. 3. The invention implements multiple insulating sleeves 305, 306, 307 wrapping around the gas inlet pipe 302 and thermocouple sheaths 303, and the caps 304. The thickness of insulating sleeves 305, 306, 307 is from about 0.6 to 1.2 cm. The shape of insulating sleeves is flat with closing devices on both sides for easily wrapping around gas inlet pipe 302 and thermocouple sheaths 303. Each cap of thermocouple sheath 303 is also wrapped by insulating sleeves 306. As observed, after implementing insulating sleeves 305, 306, 307, the temperature inside the inlet pipes can reach above from 100° C. to 150° C. The maximum heat tolerance of insulating sleeves 305, 306, and 307 is above 300° C. The effectiveness of the present invention is shown from the stable growth rate of oxide as the invention is implemented.

It should be understood that various alternatives to the structures described herein may be employed in practicing the present invention. It is intended that the following claims define the invention and that the structure within the scope of these claims and their equivalents be covered thereby.

What is claimed is:

1. An apparatus for preventing the unstable growth rate of oxide caused by water vapor remaining in the inlet pipes of a horizontal driven field oxidation tube, comprising:

a gas inlet pipe located at the center of a closed end of said horizontal driven field oxidation tube for injecting high purity gases;

a plurality of thermocouple sheaths located at an edge of the closed end of said horizontal driven field oxidation tube for locating a thermocouple therein;

a plurality of caps for covering said thermocouple sheaths; and a plurality of insulating sleeves wrapping around said gas inlet pipe, said thermocouple sheaths, and said caps for keeping the temperature therein above 100 degrees Celsius.

2. The apparatus according to claim 1, wherein each of said thermocouple sheaths has a ball joint and a matching cap.

3. The apparatus according to claim 1, wherein said gas inlet pipe has a ball joint.

4. The apparatus according to claim 1, wherein the number of said thermocouple sheaths is at least one.

5. The apparatus according to claim 1, wherein the shape of said insulating sleeves is flat with a closing device on the edge.

6. The apparatus according to claim 1, wherein the thickness of said insulating sleeves is from 0.6 cm to 1.2 cm.

7. An apparatus for preventing the unstable growth rate of oxide in a horizontal driven field oxidation tube having a gas inlet pipe located at the center of a closed end of said horizontal driven field oxidation tube, and a plurality of thermocouple sheaths each located at the closed end of said horizontal driven field oxidation tube, and a plurality of caps for covering said thermocouple sheaths, said apparatus comprising:

a first insulating sleeve for wrapping around said gas inlet pipe for keeping the temperature therein above 100 degrees Celsius;

a plurality of second insulating sleeves for wrapping around said plurality of thermocouple sheaths for keeping the temperature therein above 100 degrees Celsius; and a plurality of third insulating sleeves wrapping around said plurality of caps for keeping the temperature therein above 100 degrees Celsius.

8. The apparatus according to claim 7, wherein each of said thermocouple sheaths has a ball joint and a matching cap.

9. The apparatus according to claim 7, wherein said gas inlet pipe has a ball joint.

10. The apparatus according to claim 7, wherein the number of thermocouple sheaths is at least one.

11. The apparatus according to claim 7, wherein the shape of said insulating sleeves is flat with closing devices on both sides.

12. The apparatus according to claim 7, wherein the thickness of said insulating sleeves is from 0.6 cm to 1.2 cm.

* * * * *

UNITED STATES PATENT AND TRADEMARK OFFICE
CERTIFICATE OF CORRECTION

PATENT NO. : 5,595,605
DATED : January 21, 1997
INVENTOR(S) : Tai, et. al.

It is certified that error appears in the above-indentified patent and that said Letters Patent is hereby corrected as shown below:

Title page, item [73], Assignee: should read --Taipei--.
Title page, column 2, line 6, "Brumbauch" should read --Brumbaugh--.
Column 1, line 42, "wet oxidation" should read --dry oxidation--.
Column 1, line 43, "dry" should read --wet--.

Signed and Sealed this

Twenty-first Day of October 1997

Attest:

BRUCE LEHMAN

Attesting Officer        Commissioner of Patents and Trademarks